United States Patent [19]

Knudson

[11] 4,281,312

[45] Jul. 28, 1981

[54] SYSTEM TO EFFECT DIGITAL ENCODING OF AN IMAGE

[75] Inventor: Donald R. Knudson, Concord, Mass.

[73] Assignee: Massachusetts Institute of Technology, Cambridge, Mass.

[21] Appl. No.: 628,712

[22] Filed: Nov. 4, 1975

[51] Int. Cl.³ .......................... G06K 9/50; H04N 1/00
[52] U.S. Cl. .............. 340/146.3 MA; 340/146.3 AC; 340/146.3 H; 340/347 DD; 358/260
[58] Field of Search .......... 340/146.3 MA, 146.3 AE, 340/146.3 AC, 347 DD, 146.3 R, 146.3 H; 178/DIG. 3; 358/260–262, 282

[56] References Cited

U.S. PATENT DOCUMENTS

| | | | |
|---|---|---|---|
| 3,478,163 | 11/1969 | Chatelon | 178/DIG. 3 |
| 3,766,520 | 10/1973 | Patterson | 340/146.3 AE |
| 3,889,234 | 6/1975 | Makihara et al. | 340/146.3 MA |
| 3,899,771 | 8/1975 | Saraga et al. | 340/146.3 AE |
| 3,940,555 | 2/1976 | Amano et al. | 178/DIG. 3 |
| 3,980,809 | 9/1976 | Cook | 340/347 DD |

OTHER PUBLICATIONS

Machol, "Pseudo Halftone for Representing Continuous Tone Images . . . ", *IBM Tech. Disclosure Bulletin*, vol. 9, No. 6, Nov., 1966, pp. 636–637.

*Primary Examiner*—Leo H. Boudreau
*Attorney, Agent, or Firm*—Arthur A. Smith, Jr.; Robert F. O'Connell

[57] ABSTRACT

A system wherein an image such as, for example, unscreened artwork is divided into sub-images each of which is digitized and is then represented by the digital code of a pattern that closely matches the sub-image. Thereafter, the image is reconstructed by reproducing the pattern equivalents of the sub-images to form a composite image.

15 Claims, 3 Drawing Figures

SYSTEM TO EFFECT DIGITAL ENCODING OF AN IMAGE

The present invention relates to systems for encoding images such as, for example, newspaper graphics and for reconstructing the images from their codes.

There accompanies herewith, a copy of a report (ESL-R-616) entitled "Digital Encoding of Newspaper Graphics," which report is hereby incorporated herein by reference. Some, but not all, of the report is included in the description that follows. The description emphasizes the invention in the context of newspaper graphics, but the concepts disclosed have wider usage.

Advanced electronic newspaper-production systems are being proposed and developed which will permit computer-assisted full-page composition. In these systems, the entire newspaper content including text, artwork, and photographs are entered in the computer. The computer then structures the entire newspaper and provides a page-by-page layout of individual items assigned to each page. Manual editing of the computer layout can be performed as desired. Thus, the entire newspaper can be assembled and reviewed on computer display terminals before committing it to print. After layout, pages can be printed via a full-page photocomposer, eliminating paste-up of news and ads. In future systems, the computer may control the plate-making process as well by utilizing a laser plate-making device, or computer-stored pages may be printed directly by a plateless printing process.

Some of the technology needed to achieve full page composition electronically is now available at reasonable cost. Optical character readers, online computer terminals, and computer programs are being used by newspaper for alphanumeric (text) processing and editing. Computer graphic terminals exist for positioning ads and text on individual pages, and photo-typesetters are available for outputting on full-size newspaper pages. However, new technology is needed to reduce the cost of including newspaper graphics, including artwork and photographs, in a fully computerized composition system.

A major problem associated with the handling of newspaper graphics electronically is the large storage capacity needed to store the image elements with sufficient resolution. For unscreened artwork, data compression techniques which exploit information redundancy can be used to reduce the data needed to represent images, but current methods either do not achieve as much compression as possible or are difficult and costly to implement. Hereinafter, a new data compression technique is described which is particularly appropriate for unscreened newspaper artwork. An experimental system has been assembled to test and evaluate the technique and some initial results have been obtained.

Accordingly, it is an object of the present invention to provide a system for digitally encoding images, a system that employs data compression techniques.

Another object is to provide a digital system of the foregoing character wherein the images are unscreened newspaper artwork.

Still another object is to provide a system for reconstructing images from their digital representations as obtained by the foregoing system.

These and still further objects are discussed in the description that follows and are particularly pointed out in the appended claims.

The foregoing objects are achieved in a system for representing an image, that includes scanning means that sees the image as a series of sub-images and digitizes the same to provide as output a digital representation of each sub-image. Said output is supplied as input to comparing means which compares the digital representation of the sub-image with digital representations of a predetermined set of patterns to identify the pattern of the set that most nearly matches the digital representation of the sub-image. Thereafter, a code representing the pattern so identified can then be stored and/or transmitted to a location where the original image is reconstructed as a series of sub-images consisting of the patterns so identified.

The invention is hereinafter described with reference to the accompanying drawing in which.

As a preliminary to a discussion of specifics, further general comments are made here in order to place the present invention in proper context.

Newspaper graphics can be digitized and entered into a computer by means of a graphics scanner. Each image element is represented digitally, stored in the computer, and outputted via a graphics photocomposer to reconstruct the image. A significant cost factor in this process is the computer storage capacity needed to accommodate all the graphics appearing in the newspaper. Storage requirements, in turn, depend on the type of graphics and the coding techniques employed.

In conventional printing, photographs and black/white art work are handled differently. Separate processing techniques are employed because printing plates are inherently binary devices; that is, they either transfer ink of fixed density from plate to paper or they do not. Since they are unable to reproduce directly the various shades of gray that are present in photographs, a gray-level appearance must be achieved by means of a screening process where the image is projected onto photographic film through a fine mesh screen. Line drawings, on the other hand, contain no gray levels; like printing plates, they are binary in nature. Reproducing line drawings by means of printing plates, therefore, poses no problem akin to that encountered in the printing of photographs, and the printing plates can be made without need for special processing. Art work can therefore be printed in its original high-quality form, subject only to degradations caused by imperfections introduced during plate-making and by the spreading of ink that occurs because of the absorptive characteristics of newsprint. However, if art work is to be electronically encoded and stored without significant loss of image quality, information content must be preserved and much more storage capacity will be required than that needed to store text unless some means for compressing the data is utilized.

Figure 1:
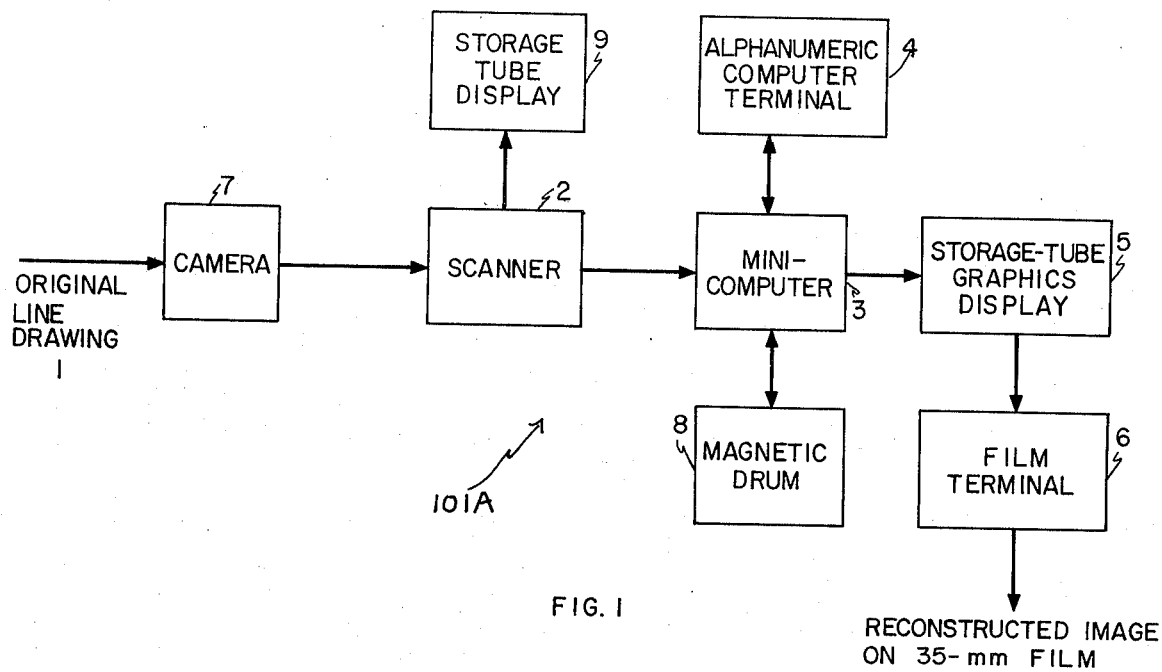
FIG. 1 shows in block diagram form a system that is operable to perform in accordance with the present inventive concepts and, in fact, represents, diagrammatically, experimental hardware actually used by the inventor to produce an image as a composite consisting of patterns selected from a set of patterns.
Figure 2:
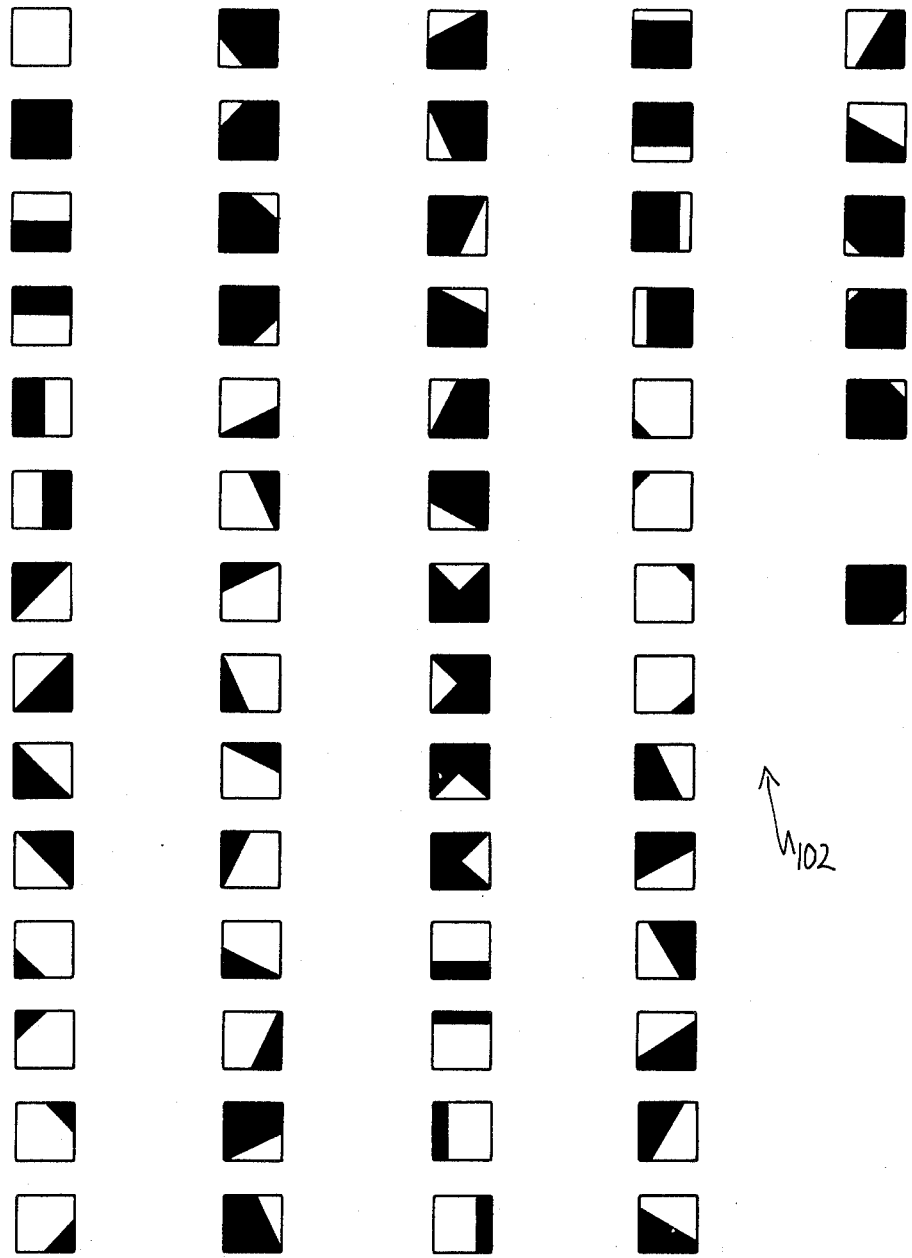
FIG. 2 shows a sixty-three pattern set.

The apparatus shown diagrammatically at 101A in FIG. 1 is operable to reproduce an image such as, for example, an image in line drawing form 1, as a photo-reproduction which is provided by photo-reproducing means 6, but only after the image has been digitized, stored, etc., by the further apparatus in FIG. 1. The system 101A includes a camera 7 which produces a photographic negative of the original line drawing. It further includes a scanner 2 that scans the image on the negative as a series of sub-images and displays the same to provide a digital representation of the sub-image. Data from the scanner 2 is fed to a computer 3 that assembles the same and stores the data on a magnetic drum 8. The computer 3 acts also to control the scanner. The digital image can be monitored as it is scanned on a storage-tube display 9. At this juncture of system operation, the sub-image appears in the form of a digital representation. The magnetic drum 8 also stores digital representations of a predetermined set of reference patterns 102 in FIG. 2 which is, but is not limited to, a sixty-two-pattern set. The digital representation of a sub-image is compared by the computer 3 with the digital representation of the patterns of the set 102 to identify a pattern of the set that most nearly matches the digital representation of the sub-image and, hence, most nearly matches the sub-image. Each said pattern has a code identification: once the pattern of the set most nearly resembling the sub-image has been identified, the code identification is stored on the drum 8 for later use or is transmitted to some local or some remote location where the original image of the line drawing 1 is reconstructed as a series of sub-images comprising a group of patterns of the set 102. Thus, the information transmitted to said location is not the digital representation of the sub-image, but is, rather, a much shorter digital code word identifying the pattern that most nearly matches the particular sub-image. In this way, the original data is compressed.

The deflection of the scanner 2 is controlled by a digital-to-analog converter within the block 2, as is well known, to scan the experimental system square-block sub-images. In the experimental setup the blocks are of the order of 1/100-inch square. In the test apparatus a storage tube graphics display terminal 5 was employed to generate x, y, z signals needed to drive the cathoderay tube (CRT) in a film terminal 6. The film terminal 6 utilizes the x,y, and z signals to generate the appropriate patterns on the CRT, thereby producing a representation of the original line drawing 1. The reproduced image is recorded on 35-millimeter film by means of a camera attached to the face of the CRT. The computer terminal labeled 4 is an alphanumeric CRT computer terminal used primarily for inputting and editing programs, but it can display the data stored on the drum 8. The system 101A produced sharp reproductions of the original image with greatly reduced digital data requirements, as is noted in said report.

Software for the minicomputer 3 consists of three major modules: a program for inputting scanner data, a pattern recognition program, and a program for outputting the vectors necessary to reconstruct the simulation of the original image. The inputting program controls the scanner, accepts scanner data, and packs it on consecutive drum tracks. Input data can be selected from an area less than the complete scan area by setting the start and stop limits appropriately when initiating the program.

The pattern recognition module in the software retrieves the scanner data from the drum and selects the pattern most nearly matching the data. In order to speed up the process, the number of one's are counted in an $8 \times 8$ data array first. If the count exceeds sixty one or is less than three, the pattern selected is solid black or white, respectively. Normally, an image contains large areas of solid white or black and these patterns can be detected quickly from the count of one's. If the one's count is in the range of three to sixty one, the matching process consists of comparing each bit of the $8 \times 8$ array with its corresponding bit of the pattern, matching both ones and zeros. A count of matching bits is calculated for each pattern in the sub-set, and the code for the pattern with the highest match count is stored on the drum.

The output program uses the pattern codes to address a series of vectors which simulate the various patterns. The set of vectors for a pattern are sent via 8-bit codes using the normal "short vector mode" formats of the graphic display terminal 5. Null patterns are not transmitted, but are used to increment a running set point by one pattern width. After a string of one or more null patterns is ended by a non-null code, a set-point-mode character is transmitted to the terminal 5, followed by the updated set-point data. This moves the CRT beam of the terminal 5 to the starting location for the next non-null pattern; considerable time is saved by skipping over blank portions of the image. For non-blank areas, up to twelve vectors are used to simulate the various sub-picture or sub-image patterns. Vector data are stored in core and can be modified to evaluate different pattern sets.

Figure 3:
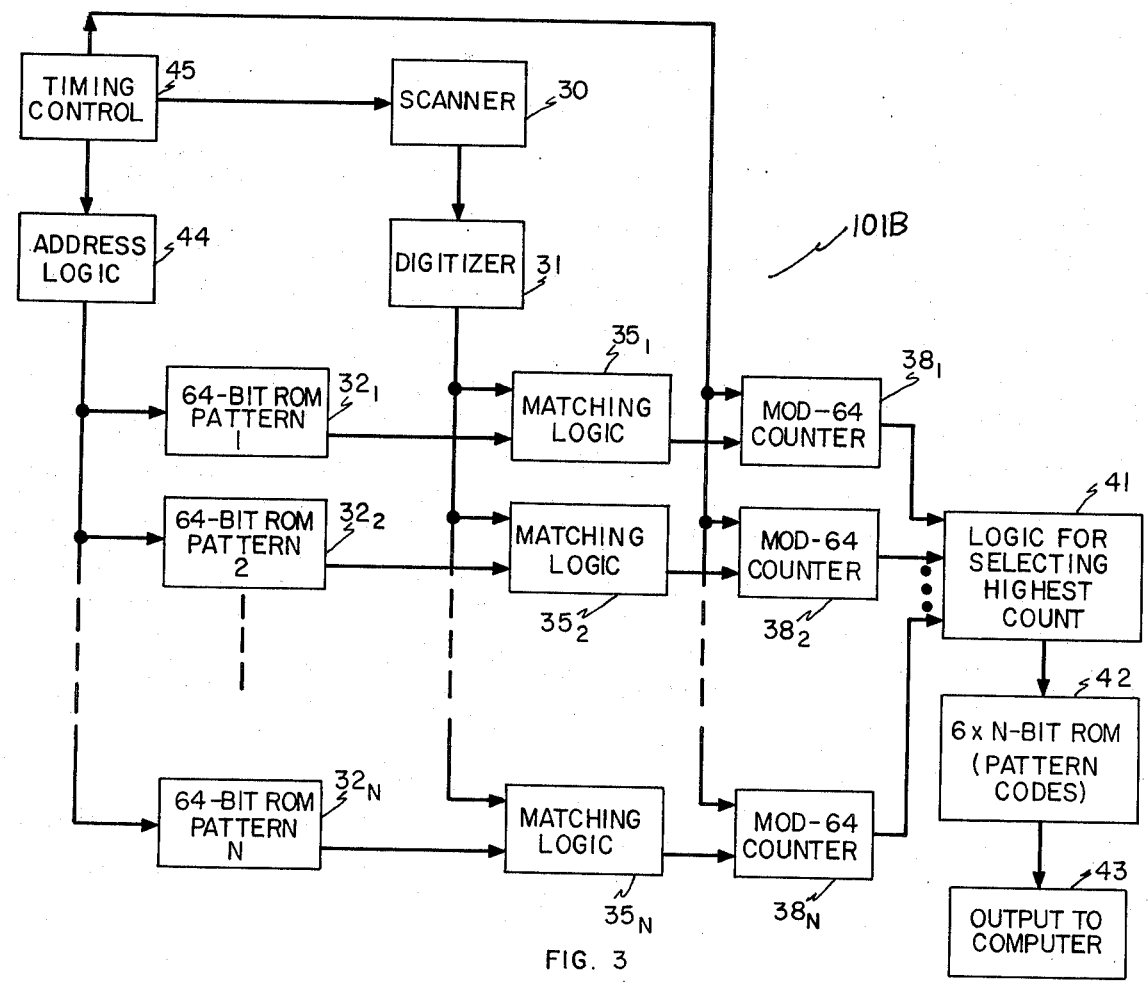
FIG. 3 shows, in block diagram form, an alternative system that performs the same overall function as the system of FIG. 1.

The system 101A in FIG. 1 is intended for experimental purposes only; other configurations such as the system marked 101B in FIG. 3 are feasible, which provide sufficient area coverage and processing times for an operational system. A laser scanner employing a rotating mirror in the high-speed scanning direction and a mechanical transport for scanning in the orthogonal direction, can be used to provide full-page coverage. Square sub-pictures can be scanned by interposing a solid state optical deflector for small vertical deflections Such equipment can easily scan at $10^6$ bits per second, so that a full-size newspaper page could be scanned in approximately five minutes. To achieve higher throughputs so that more pages per hour can be processed by the computer, additional scanners operated in parallel can be utilized.

FIG. 3 shows a hardware configuration that can select block patterns as an image is scanned, rather than matching sub-pictures or sub-images to patterns in a computer after the entire image is scanned. In this configuration, the scan data are from a scanner 30 and are digitized by a digitizer 31 and compared to the patterns as the image is scanned so that no additional computer processing time is required. By comparing the data to all patterns in parallel, the comparison can be made on-the-fly without slowing the scanner. The scanner signal is converted to a binary signal by the digitizer 31 and compared to the appropriate bit for each pattern. The pattern bits are stored in read-only-memories (ROM) $32_1, 32_2 \ldots 32_N$ as $8 \times 8$-bit arrays corresponding to the block scanning format. A timing control 45 advances both the scanner 30 and ROM address logic 44 to step through the block and pattern elements in synchronism. For each bit where the scan data and the pattern match, the respective counter, $38_1, 38_2$ or . . .

$38_N$, for that pattern is incremented. The counter with the highest count at the end of the block scan represents the pattern which best matches the sub-picture image, and this counter is selected by logic circuitry 41. The code for the nearest matching pattern is selected from a read-only-memory 42 and transmitted to a computer by additional circuitry 43. Parallel processing requires a pattern ROM, comparison logic, and a mod-64 counter for each pattern in the set. In FIG. 3 the pattern ROM includes the blocks $32_1, 32_2 \ldots 32_N$, the comparison logic includes blocks $35_1, 35_2 \ldots 35_N$, respectively, and the mod-64 counters includes the blocks $38_1, 38_2 \ldots 38_N$, respectively.

The compression techniques herein disclosed result in approximately a ten-to-one compression ratio for typical artwork.

The encoding of block patterns has an additional advantage over some other data-compression methods in that it maintains a one-to-one spatial correspondence between the image codes and the original image. In run-length coding for example, a given address in the coded image has no fixed relationship to any image location because all the previous run-lengths influence which image segment the code represents. However, in the block-pattern coding scheme herein disclosed, each code relates to a specific sub-picture or sub-image, and each block code is independent of all other image segments. Therefore, a block coding error affects only one small segment of the picture, whereas an error in run-length coding displaces all subsequent image elements. Since in future newspaper systems the computer is likely to be involved in editing and modifying the digitally stored pictures, a direct spatial correspondence between the coded picture and the actual image is an asset toward achieving more efficient programs. Also, the limited distortion due to errors is an advantage in transmitting encoded pictures in facsimile systems over longer distances wherein low transmission error rates are difficult to achieve.

The ten-to-one compression ratio above noted compares favorably with other data compression techniques, particularly those of comparable simplicity. However, even higher compression can be achieved by adding a second processing phase where standard data-compression techniques are applied to the block-pattern codes themselves. Variable-length coding, for example, can be applied to the pattern codes to achieve an additional compression factor of three or so, for an over-all compression ratio of approximately thirty-to-one. However, the additional coding may complicate the correspondence between the image and the stored codes, and the choice between minimum storage requirements versus higher image-processing efficiency depends on the specific application.

The block-pattern-coding technique herein described has significant advantages in efficiency and simplicity over other newspaper picture encoding methods. Although some detailed information is discarded or distorted when patterns from a limited set are substituted for the original sub-pictures, the experimental results discussed in said report indicate that this has negligible effect under normal viewing conditions if the recommended pattern set and sub-picture size are used.

Further modifications of the invention herein disclosed will occur to persons skilled in the art and all such modifications are deemed to be within the spirit and scope of the invention as defined by the appended claims.

What is claimed is:

1. A method of representing an image, that comprises: scanning the image as a series of sub-images in uniform block form wherein block dimensions are the order of 1/100-inch, digitizing the same, comparing a digital representation of the same with digital representations of a set of reference blocks to select a reference block that most nearly matches the sub-image, and reproducing said image from the digital representations of the selected reference blocks.

2. A method of representing an image, that comprises: scanning the image as a series of sub-images to digitize the same and provide a digitized representation of the sub-image; comparing the digitized representation of each sub-image with digital representations of a set of reference patterns that differ from one another to identify a pattern of the set of reference patterns that most nearly matches the sub-image, each sub-image being in the form of a block whose outline dimensions are the order of 1/100-inch and each block being identified and located in terms of its spatial position within the image as a whole, each pattern of the set being assigned a unique code identification; and transmitting the code identification of each identified pattern in a predetermined order to a local location or a remote location and reconstructing the image at said location as a series of sub-images, each sub-image thus reconstructed being the pattern most nearly resembling the sub-image originally scanned.

3. A method of digitally representing an image as claimed in claim 2 wherein each pattern of the set of reference patterns has a unique code identification and which includes storing the code identification of each identified pattern.

4. A method of digitally representing an image as claimed in claim 2 which includes storing the code identification of each identified pattern.

5. A method of representing an image as claimed in claim 2 which includes storing the code identification of the identified patterns.

6. A method of digitally representing an image as claimed in claim 5 that includes the further step of reconstructing the image by generating a series of patterns on the basis of said code identification, serially and in the same order as the sub-image represented by each code identification appears in the course of said scanning.

7. A method of digitally representing an image as claimed in claim 5 that further includes transmitting the code identification of each identified pattern in a predetermined order to a remote location and reconstructing the image at said remote location by generating a series of patterns on the basis of the coded and transmitted information.

8. A method of digitally representing an image as claimed in claim 2 wherein the code of the identified patterns is compressed by further data compression techniques.

9. Apparatus for representing and reproducing an image, of arbitrary shape that comprises, in combination: means for scanning the image as a series of sub-images to digitize the same and for providing a digital representation of the sub-image, each sub-image being a block whose dimensions are the order of 1/100-inch; means for comparing the digital representation of the sub-image with digital representations of a predetermined set of patterns to identify a pattern of the set that most nearly matches the digital representation of the sub-image and hence most nearly matches the sub-image, each pattern of the set having a code identification; and means that receives the code identification representation of the pattern most nearly resembling each sub-image and that reconstructs the original image as a series of sub-images on the basis of the code indentifications of a group of the patterns, each sub-image thus reconstructed being the pattern most nearly resembling the sub-image originally scanned.

10. Apparatus as claimed in claim 9 that further includes means to compress the code identifications prior to receipt of the same by the means that receives and that reconstructs the original image as a series of sub-images comprising a group of said patterns.

11. Apparatus as claimed in claim 9 wherein each pattern of the set has a code identification and which includes means for storing the code of each identified pattern.

12. Apparatus as claimed in claim 11 that further includes transmission means to transmit the code identification to a remote location removed from the means for scanning and the means for comparing.

13. Apparatus as claimed in claim 12 that further includes patterngeneration means at said location to receive the transmitted code of each sub-image and to convert the code to its appropriate pattern to reconstruct the original image as a series of sub-images.

14. A system wherein an image of arbitrary shape is reproduced as a series of patterns much smaller than the original image tht comprises, in combination: scanning means that scans the image as a series of sub-images and digitizes the same to provide a binary representation of each sub-image, each sub-image being a fixed-size block whose outline dimensions are the order of 1/100-inch; comparing means tht compares the digital representation of each sub-image on a point-by-point basis with digital representations of a predetermined limited set of patterns to identify a pattern of the limited set that most nearly matches the digital representation of the sub-image and hence most nearly matches the sub-image; identifying the selected reference pattern by a digital code; and reconstructing means that reconstructs the original image as a composite comprising a plurality of said patterns on the basis of said code.

15. A system wherein an image of arbitrary shape is reproduced as a series of patterns much smaller than the original image that comprises, in combination: means that digitizes the image as a series of sub-images and provides a binary representation of each sub-image, each sub-image being a fixed-size block whose outline dimensions are much smaller than the original image; comparing means that compares the digital representation of each sub-image with digital representations of a predetermined limited set of patterns to identify a pattern of the limited set that most nearly matches the digital representation of the sub-image and hence most nearly matches the sub-image; and reconstructing means that reconstructs the original image as a composite comprising a plurality of said patterns.

* * * * *